US008279761B2

(12) United States Patent
Nguyen

(10) Patent No.: US 8,279,761 B2
(45) Date of Patent: Oct. 2, 2012

(54) INPUT/OUTPUT INTERFACE FOR PERIODIC SIGNALS

(75) Inventor: Andy Nguyen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 319 days.

(21) Appl. No.: 12/790,744

(22) Filed: May 28, 2010

(65) Prior Publication Data

US 2011/0292950 A1    Dec. 1, 2011

(51) Int. Cl.
| G08C 15/00 | (2006.01) |
| H04L 12/52 | (2006.01) |
| H04J 1/02 | (2006.01) |
| H04J 3/02 | (2006.01) |
| H04B 1/38 | (2006.01) |
| H04N 7/035 | (2006.01) |
| H03K 4/06 | (2006.01) |
| H03L 7/06 | (2006.01) |

(52) U.S. Cl. ........ 370/249; 370/419; 370/497; 370/539; 375/221; 375/240.07; 327/137; 327/146

(58) Field of Classification Search .......... 370/241–255, 370/290–291, 419–421, 463, 488, 496–497, 370/532–545; 375/220–221, 240.2, 252, 375/358; 327/5, 16–17, 54, 67, 72–73, 87–88, 327/91–96, 137, 146, 155, 243, 334–363
See application file for complete search history.

(56) References Cited

U.S. PATENT DOCUMENTS

| 6,636,110 | B1 * | 10/2003 | Ooishi et al. ................. 327/565 |
| 7,071,756 | B1 * | 7/2006 | Vadi et al. ..................... 327/293 |
| 7,099,278 | B2 * | 8/2006 | Momtaz ........................ 370/249 |
| 7,102,391 | B1 | 9/2006 | Sun et al. |
| 7,173,495 | B1 | 2/2007 | Kenny et al. |
| 7,619,451 | B1 | 11/2009 | Hoang et al. |
| 7,764,095 | B2 * | 7/2010 | Werner et al. ................. 327/158 |
| 2002/0118043 | A1 * | 8/2002 | Enam et al. ..................... 326/89 |
| 2003/0184355 | A1 * | 10/2003 | Lee ............................... 327/158 |
| 2007/0103212 | A1 * | 5/2007 | Lee et al. ....................... 327/149 |
| 2007/0273410 | A1 | 11/2007 | Miike |
| 2008/0101523 | A1 | 5/2008 | Kurd et al. |
| 2010/0090735 | A1 | 4/2010 | Cho |
| 2010/0220776 | A1 * | 9/2010 | Abel et al. ..................... 375/224 |
| 2011/0199138 | A1 * | 8/2011 | Sano ............................. 327/158 |

OTHER PUBLICATIONS

Korean Intellectual Property Office, International Search Report and Written Opinion of the International Searching Authority, international application PCT/US2011/037309, Nov. 23, 2011, pp. 1-10.
Altera Corporation, "Stratix IV Device Handbook, vol. 1," Nov. 2008, pp. 1-390.

* cited by examiner

*Primary Examiner* — Tri H Phan
(74) *Attorney, Agent, or Firm* — Steven J. Cahill

(57) ABSTRACT

A first periodic signal generation circuit generates first periodic output signals. A second periodic signal generation circuit generates second periodic output signals. A first multiplexer circuit receives the first and the second periodic output signals. An interface circuit coupled to external pins generates a third periodic output signal based on a periodic signal selected by the first multiplexer circuit. A second multiplexer circuit receives the third periodic output signal at an input. A first periodic feedback signal provided to the first periodic signal generation circuit is based on a signal selected by the second multiplexer circuit. A third multiplexer circuit receives the third periodic output signal at an input. A second periodic feedback signal provided to the second periodic signal generation circuit is based on a signal selected by the third multiplexer circuit.

20 Claims, 10 Drawing Sheets

INPUT/OUTPUT INTERFACE FOR PERIODIC SIGNALS

BACKGROUND

The present invention relates to electronic circuits, and more particularly, to input/output interface circuits for periodic signals.

FIG. 1 illustrates an example of a prior art interface circuit 100 on an integrated circuit. Interface circuit 100 includes buffer circuit 102, phase-locked loop 103, a circuit 106 that contains 7 counter circuits, multiplexer circuits 111-116, single-ended buffer circuits 121-127, differential buffer circuits 131-132, and external pins 101 and 141-146.

Buffer circuit 102 buffers an input clock signal CLKIN received from pin 101 to generate a reference clock signal CLKREF at an input of phase-locked loop (PLL) circuit 103. PLL 103 generates output clock signals CLKOUT using voltage-controlled oscillator (VCO) 104 in response to reference clock signal CLKREF. The counter circuits in circuit 106 divide the frequencies of output clock signals CLKOUT to generate 6 frequency divided clock signals CLK0-CLK5. Multiplexer circuits 111-116 are configured to provide clock signals CLK0-CLK5 to inputs of buffer circuits 121-126, respectively. In a feedback mode, one of the 6 frequency divided clock signals CLK0-CLK5 is the source of clock signal CLKX. CLKX is transmitted to a counter circuit in circuit 106 that multiplies the frequency of clock signal CLKX to generate the feedback clock signal CLKFB for PLL circuit 103. The frequency of CLKFB is the same as the frequency of clock signal CLKIN and signal clock signal CLKREF.

When buffer circuits 123 and 127 are enabled in a mode of operation referred to as zero delay buffer mode, buffer circuit 127 buffers the output clock signal of buffer circuit 123 to generate a buffered clock signal CLKX that is provided to one of the counter circuits in circuit 106. The counter circuit multiplies the frequency of clock signal CLKX to generate a frequency multiplied feedback clock signal CLKFB that is provided to an input of PLL 103. PLL 103 compares the phases and frequencies of CLKREF and CLKFB to generate clock signals CLKOUT.

When buffer circuits 121-122 and 127 are enabled and buffer circuit 123 is disabled in a mode of operation referred to as single-ended external feedback mode, buffer circuits 121-122 buffer the output clock signals of multiplexers 111-112 to generate single-ended clock signals at pins 141-142, respectively. One of these single-ended clock signals is transmitted through external conductors (not shown) to pin 143. Buffer circuit 127 buffers the clock signal received at pin 143 to generate a buffered clock signal CLKX that is provided to the counter circuit in circuit 106 generating feedback clock signal CLKFB.

When differential buffer circuits 131-132 are enabled and buffer circuits 121-124 and 127 are disabled in a mode of operation referred to as differential external feedback mode, differential buffer circuit 131 buffers the output clock signal of multiplexer 111 to generate a differential clock signal at pins 141-142. The differential clock signal is transmitted through external conductors (not shown) to pins 143-144. Differential buffer circuit 132 buffers the differential clock signal received at pins 143-144 to generate a buffered single-ended clock signal CLKX. CLKX is provided to the counter circuit in circuit 106 that generates feedback clock signal CLKFB.

BRIEF SUMMARY

According to some embodiments, a first periodic signal generation circuit generates first periodic output signals. A second periodic signal generation circuit generates second periodic output signals. A first multiplexer circuit receives the first and the second periodic output signals. An interface circuit coupled to external pins generates a third periodic output signal based on a periodic signal selected by the first multiplexer circuit. A second multiplexer circuit receives the third periodic output signal at an input. A first periodic feedback signal provided to the first periodic signal generation circuit is based on a signal selected by the second multiplexer circuit. A third multiplexer circuit receives the third periodic output signal at an input. A second periodic feedback signal provided to the second periodic signal generation circuit is based on a signal selected by the third multiplexer circuit.

Various objects, features, and advantages of the present invention will become apparent upon consideration of the following detailed description and the accompanying drawings.

DETAILED DESCRIPTION

Figure 1:
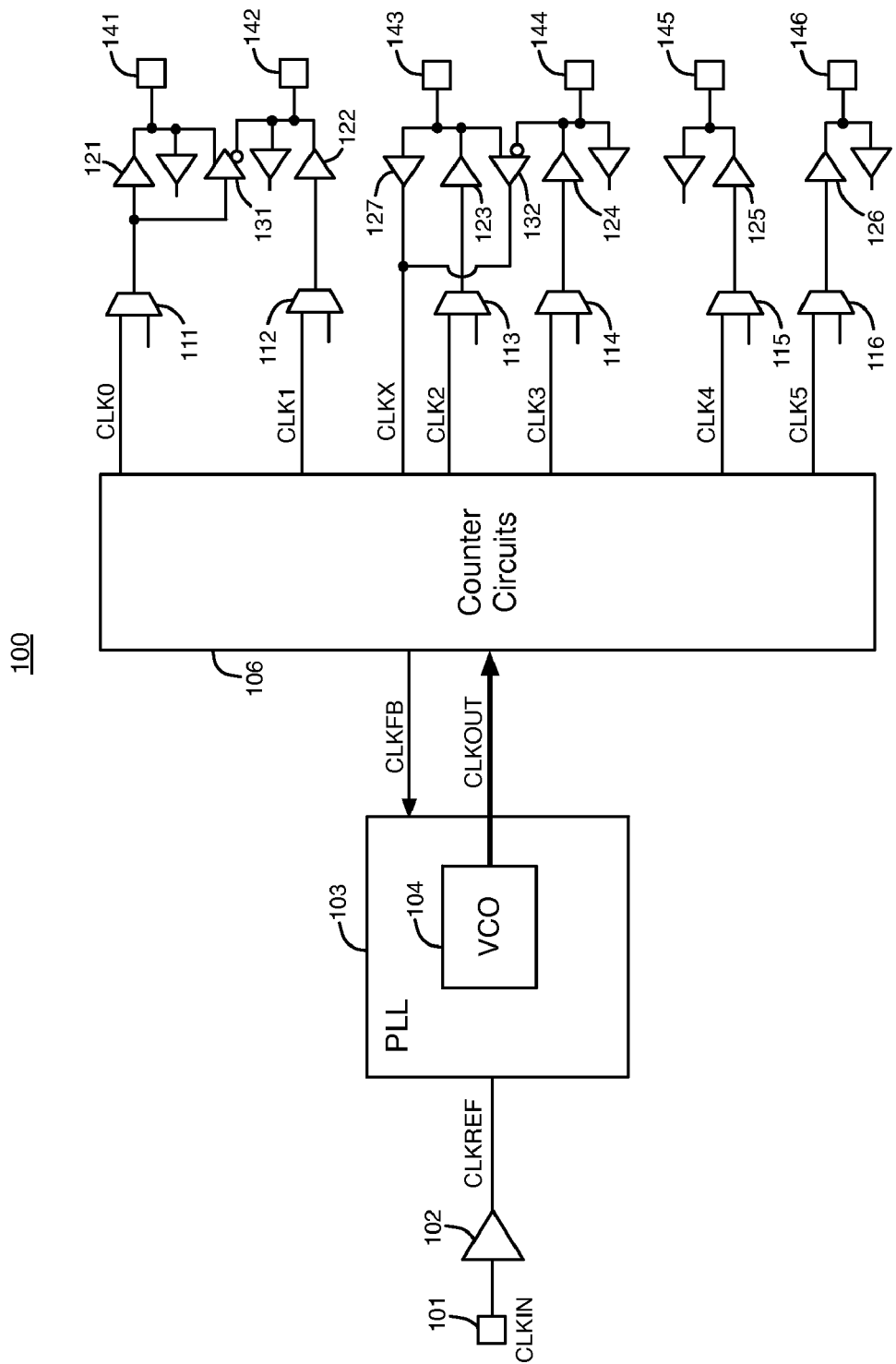
FIG. 1 illustrates an example of a prior art interface circuit on an integrated circuit.
Figure 2A:
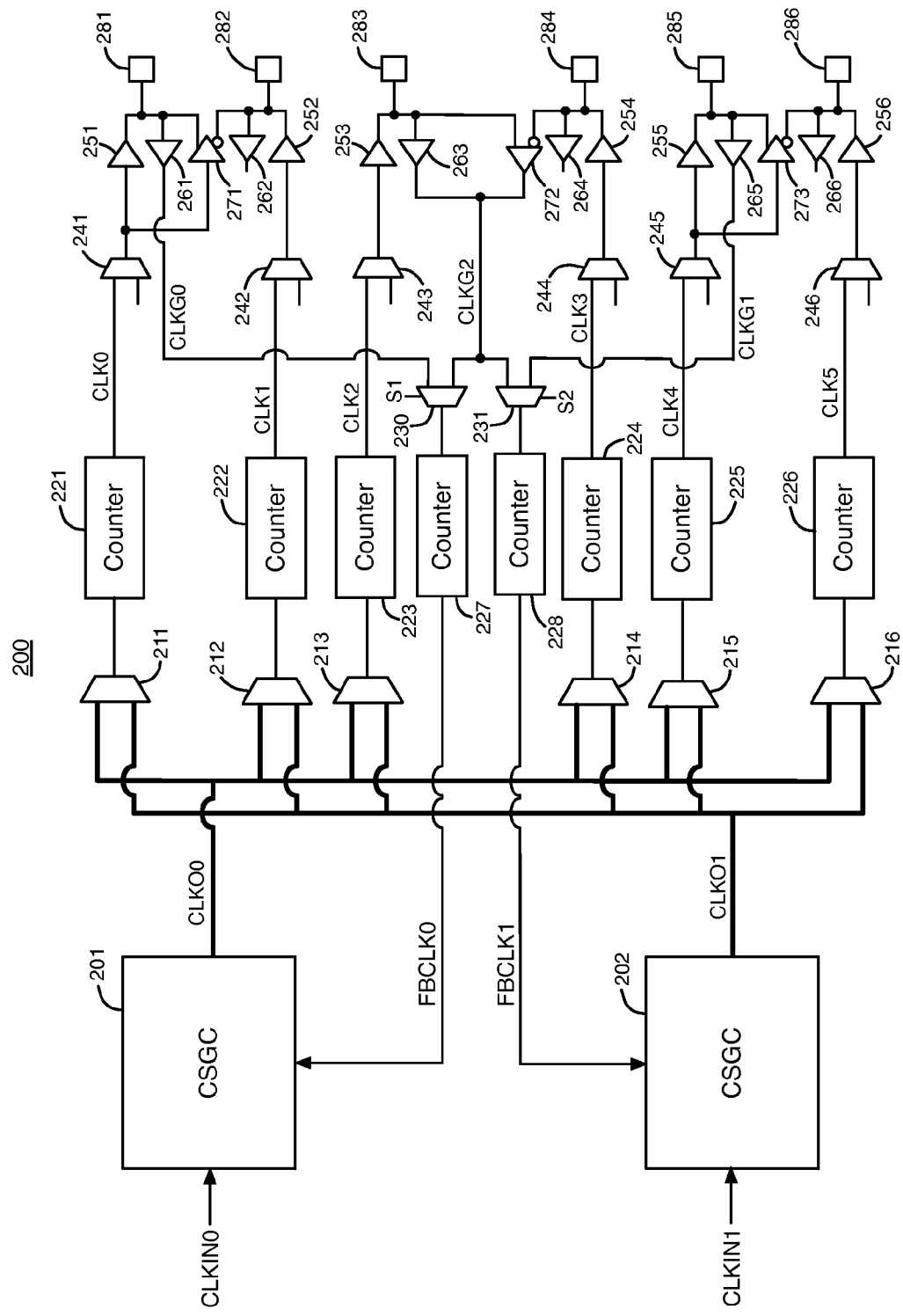
FIG. 2A illustrates a 6-pin input/output interface circuit on an integrated circuit, according to an embodiment of the present invention.

FIG. 2A illustrates a 6-pin input/output interface circuit 200 on an integrated circuit, according to an embodiment of the present invention. Input/output interface circuit 200 includes clock signal generation circuits (CSGC) 201-202, multiplexers 211-216, counter circuits 221-228, multiplexers 230-231 and 241-246, single-ended output buffer circuits 251-256, single-ended input buffer circuits 261-266, differential output buffer circuits 271 and 273, differential input buffer circuit 272, and 6 pins 281-286. Pins 281-286 are external terminals of the integrated circuit that contains interface circuit 200.

Each of the clock signal generation circuits 201-202 can, for example, include a phase-locked loop (PLL) circuit and a delay-locked loop (DLL) circuit. Alternatively, each of clock signal generation circuits 201-202 have a DLL but not a PLL.

A periodic input reference clock signal CLKIN0 is provided to a first input of clock signal generation circuit (CSGC) 201. Clock signal generation circuit 201 generates multiple periodic output clock signals CLKO0 (e.g., 4, 6, 8, 12, or 16 clock signals) in response to input reference clock signal CLKIN0. Clock signals CLKO0 are provided to inputs of each of the multiplexers 211-216.

A periodic input reference clock signal CLKIN1 is provided to a first input of clock signal generation circuit (CSGC) 202. Clock signal generation circuit 202 generates multiple periodic output clock signals CLKO1 (e.g., 4, 6, 8, 12, or 16 clock signals) in response to input reference clock signal CLKIN1. Clock signals CLKO1 are provided to inputs of each of the multiplexers 211-216.

Each of the 6 multiplexer circuits 211-216 is configured by a select signal (not shown) to select one of the clock signals from among clock signals CLKO0 and CLKO1. Multiplexer circuits 211-216 transmit the 6 selected clock signals to inputs of counter circuits 221-226, respectively. Counter circuits 221-226 function as frequency divider circuits. Counter circuits 221-226 divide the frequencies of the 6 output clock signals of multiplexer circuits 211-216 to generate 6 frequency divided clock signals CLK0-CLK5, respectively.

Circuit 227 and circuit 228 function as frequency multiplier circuits. If one of counter circuits 221-226 divides the frequency of one of the 6 output clock signals CLK0-CLK5 by N, and that frequency divided clock signal is fed back as clock signal CLKG0, CLKG1, or CLKG2, then counter circuit 227 or counter circuit 228 multiplies its input clock signal by the same value N. Value N can be, for example, 1 or another positive integer or fractional number. When N=1, the output clock signals CLKO0-CLKO1, the divided by N clock signals CLK0-CLK5, and clock signals CLKG0-CLKG2 are the same frequency. Multiplexer circuits 241-246 are configured by select signals (not shown) to provide the 6 clock signals CLK0-CLK5 to inputs of output buffer circuits 251-256, respectively.

In an embodiment of FIG. 2A referred to as single-ended zero delay buffer mode, buffer circuits 251, 261, 253, 263, 255, and 265 are enabled, and buffer circuits 271-273 are disabled. The remaining buffer circuits in FIG. 2A may be enabled or disabled. Output buffer circuit 251 buffers the output clock signal of multiplexer 241 to generate a buffered clock signal at the input of input buffer circuit 261. Input buffer circuit 261 buffers the buffered output clock signal of buffer circuit 251 to generate a buffered clock signal CLKG0 that is provided to a first input of multiplexer 230.

Output buffer circuit 253 buffers the output clock signal of multiplexer 243 to generate a buffered output clock signal at the input of input buffer circuit 263. Input buffer circuit 263 buffers the buffered output clock signal of buffer circuit 253 to generate a buffered clock signal CLKG2 at a second input of multiplexer 230 and at a first input of multiplexer 231. Multiplexer 230 is configured by select signal S1 to select either clock signal CLKG0 or clock signal CLKG2. The clock signal selected by multiplexer 230 is provided to the input of counter circuit 227. Counter circuit 227 generates feedback clock signal FBCLK0 based on the clock signal selected by multiplexer 230.

Clock signal FBCLK0 functions as a feedback clock signal for clock signal generation circuit 201. Counter circuit 227 functions as a feedback frequency multiplier circuit. CSGC circuit 201 varies the phases of clock signals CLKO0 in response to changes in the phase of feedback clock signal FBCLK0 to align the phases of FBCLK0 and CLKIN0.

Output buffer circuit 255 buffers the output clock signal of multiplexer 245 to generate a buffered output clock signal at the input of input buffer circuit 265. Input buffer circuit 265 buffers the buffered output clock signal of buffer circuit 255 to generate a buffered clock signal CLKG1 at a second input of multiplexer 231. Multiplexer 231 is configured by select signal S2 to select either clock signal CLKG1 or clock signal CLKG2. The clock signal selected by multiplexer 231 is provided to the input of counter circuit 228. Counter circuit 228 generates feedback clock signal FBCLK1 based on the clock signal selected by multiplexer 231.

Clock signal FBCLK1 functions as a feedback clock signal for clock signal generation circuit 202. Counter circuit 228 functions as a feedback frequency multiplier circuit. CSGC circuit 202 varies the phases of clock signals CLKO1 in response to changes in the phase of feedback clock signal FBCLK1 to align the phases of FBCLK1 and CLKIN1.

In the single-ended zero delay buffer mode embodiment of interface circuit 200, each of the feedback clock signals FBCLK0 and FBCLK1 is generated in response to a clock signal that is routed through an input buffer circuit and an output buffer circuit. Each of the feedback clock signals FBCLK0 and FBCLK1 is generated based on one of the output clock signals CLKO0 of clock signal generation circuit 201 or one of the output clock signals CLKO1 of clock signal generation circuit 202.

Figure 2B:
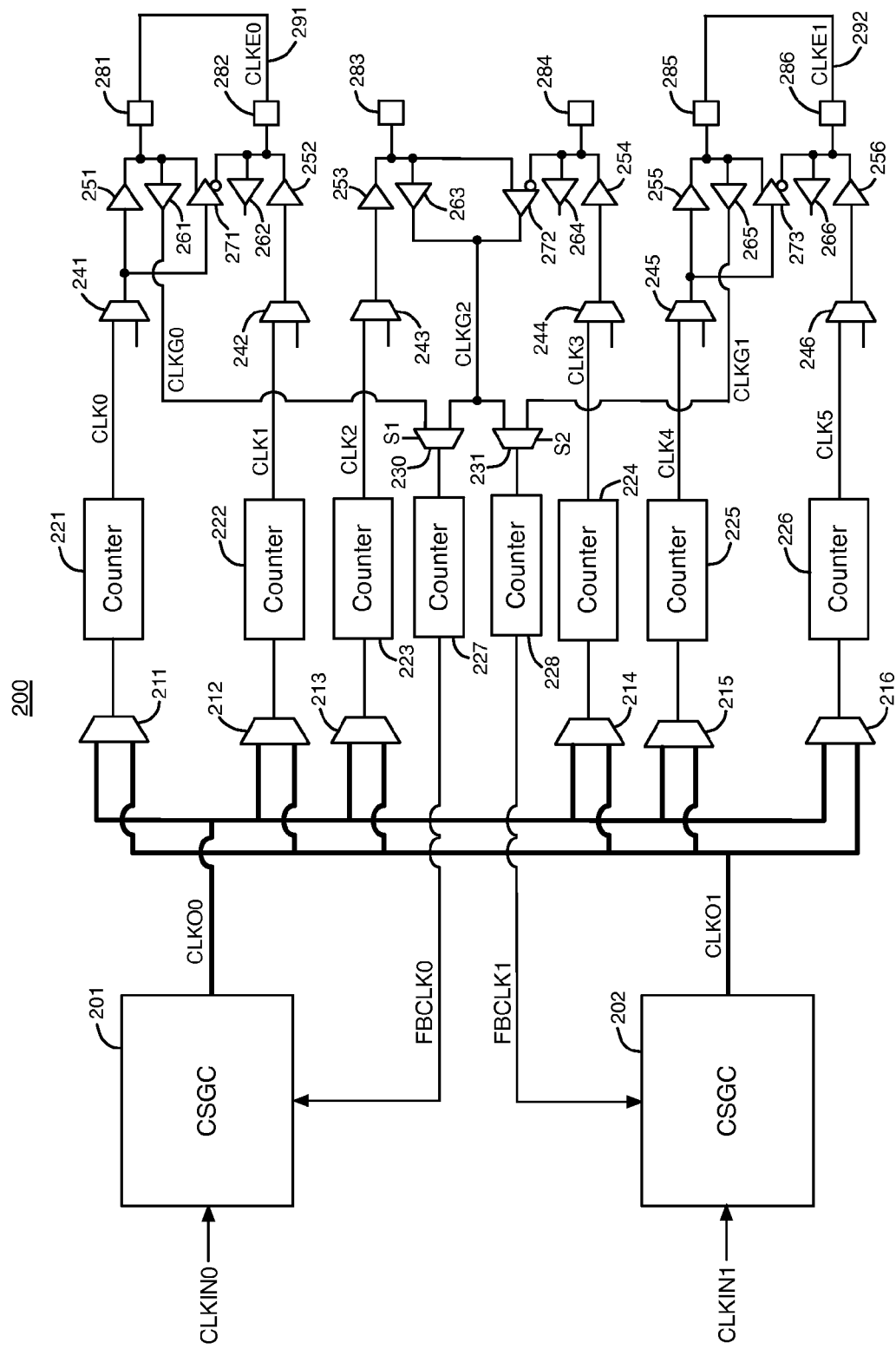
FIG. 2B illustrates alternative configurations of the input/output interface circuit of FIG. 2A that can be used for single-ended external feedback modes, according to additional embodiments of the present invention.

FIG. 2B illustrates alternative configurations of input/output interface circuit 200 that can be used for single-ended external feedback modes, according to additional embodiments of the present invention.

In an embodiment of interface 200 referred to as single-ended external feedback buffer mode, buffer circuits 252, 261, 256, and 265 are enabled, and buffer circuits 251, 253, 255, 263, and 271-273 are disabled. The remaining buffer circuits in FIG. 2B may be enabled or disabled. Output buffer circuit 252 buffers the output clock signal of multiplexer 242 to generate a buffered clock signal CLKE0 at pin 282. External conductor 291 shown in FIG. 2B is located outside the integrated circuit die that contains interface circuit 200. Clock signal CLKE0 is transmitted through external conductor 291 from pin 282 to pin 281.

Input buffer circuit 261 buffers the clock signal CLKE0 received from pin 281 to generate a buffered clock signal CLKG0 that is provided to an input of multiplexer circuit 230. Multiplexer circuit 230 is configured based on the logic state of select signal S1 to provide clock signal CLKG0 to an input of counter circuit 227. Counter circuit 227 generates clock signal FBCLK0 in response to the output clock signal of multiplexer 230, as described above. Clock signal FBCLK0 is provided to an input of CSGC 201.

Also, in the single-ended external feedback buffer mode, output buffer circuit 256 buffers the output clock signal of multiplexer 246 to generate a buffered clock signal CLKE1 at pin 286. External conductor 292 shown in FIG. 2B is located outside the integrated circuit die that contains interface circuit 200. Clock signal CLKE1 is transmitted through external conductor 292 from pin 286 to pin 285.

Input buffer circuit 265 buffers the clock signal CLKE1 received from pin 285 to generate a buffered clock signal CLKG1 that is provided to an input of multiplexer circuit 231. Multiplexer circuit 231 is configured based on the logic state of select signal S2 to provide clock signal CLKG1 to an input of counter circuit 228. Counter circuit 228 generates clock signal FBCLK1 in response to the output clock signal of multiplexer 231. Clock signal FBCLK1 is provided to an input of CSGC 202.

In the single-ended external feedback buffer mode embodiments described herein, the feedback clock signal FBCLK0 of clock signal generation circuit 201 is generated in response to a clock signal that is transmitted through an external conductor. Also, in the single-ended external feedback buffer mode embodiments described herein, the feedback clock signal FBCLK1 of clock signal generation circuit 202 is generated in response to a clock signal that is transmitted through an external conductor.

In any of the embodiments described herein, feedback clock signal FBCLK0 is generated in response to one of the output clock signals CLKO0 of clock signal generation circuit 201 or in response to one of the output clock signals CLKO1 of clock signal generation circuit 202. In any of the embodiments described herein, feedback clock signal FBCLK1 is generated in response to one of the output clock signals CLKO0 of clock signal generation circuit 201 or in response to one of the output clock signals CLKO1 of clock signal generation circuit 202.

Figure 2C:
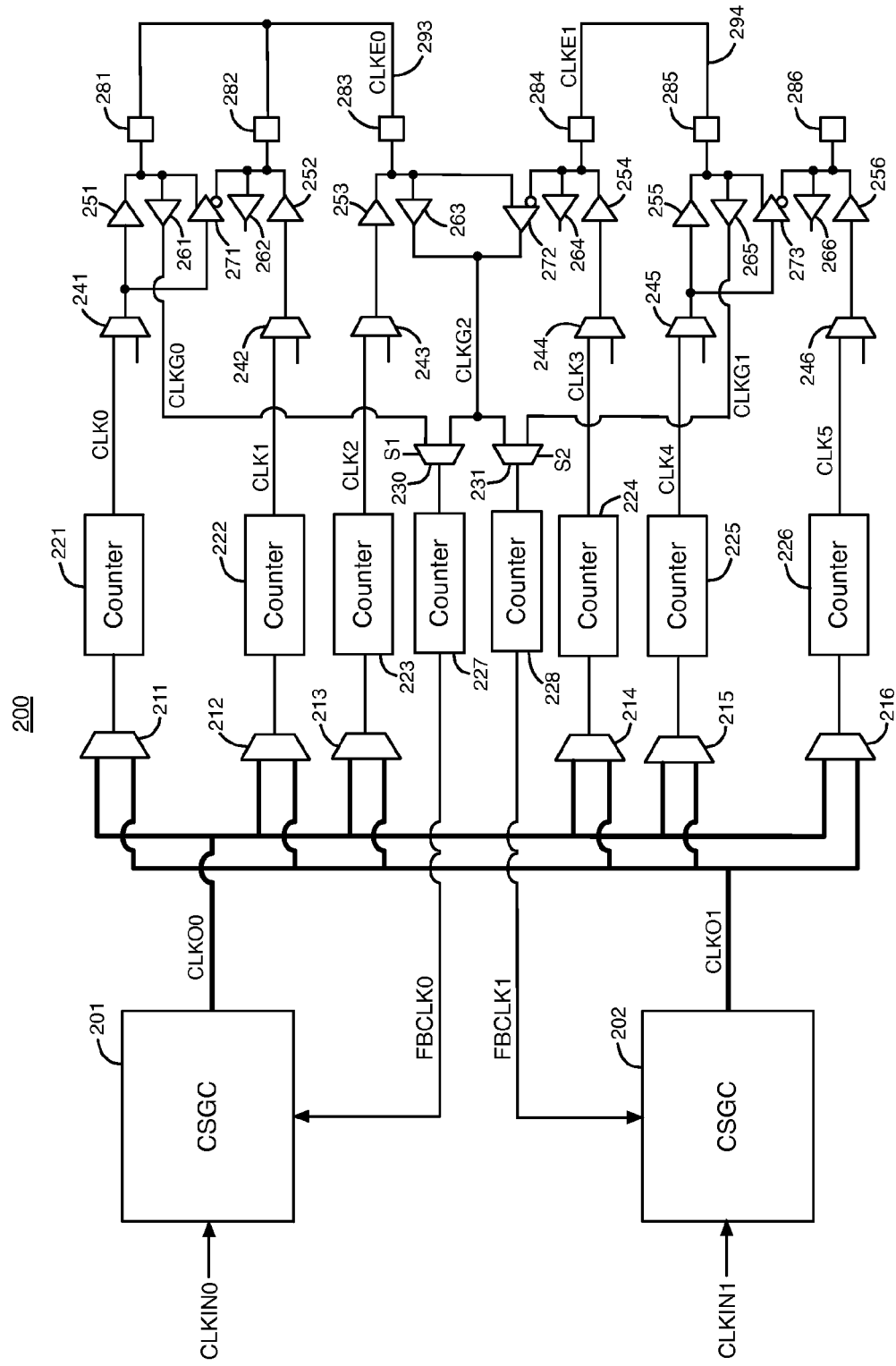
FIG. 2C illustrates alternative configurations of the input/output interface circuit of FIG. 2A that can be used for additional single-ended external feedback modes, according to embodiments of the present invention.

FIG. 2C illustrates alternative configurations of input/output interface circuit 200 that can be used for additional single-ended external feedback modes, according to embodiments of the present invention.

In one embodiment of FIG. 2C, buffer circuits 251 and 263 are enabled, and buffer circuits 261, 252, 253, and 271-272 are disabled. In this embodiment, buffer circuit 251 generates a buffered output clock signal CLKE0 at pin 281 in response to the clock signal selected by multiplexer 241. CLKE0 is transmitted from pin 281 through external conductor 293 to pin 283 at an input of buffer circuit 263. Buffer circuit 263 generates a buffered clock signal CLKG2 that is provided to inputs of multiplexers 230-231 in response to clock signal CLKE0 at pin 283. Multiplexer 230 may be configured to provide buffered clock signal CLKG2 to the input of counter circuit 227. Multiplexer 231 may be configured to provide buffered clock signal CLKG2 to the input of counter circuit 228.

In another embodiment of FIG. 2C, buffer circuits 253 and 261 are enabled, and buffer circuits 251, 252, 263, and 271-272 are disabled. In this embodiment, buffer circuit 253 generates a buffered output clock signal CLKE0 at pin 283 in response to the clock signal selected by multiplexer 243. CLKE0 is transmitted from pin 283 through external conductor 293 to pin 281 at an input of buffer circuit 261. Buffer circuit 261 generates a buffered clock signal CLKG0 that is provided to an input of multiplexer 230 in response to clock signal CLKE0. Multiplexer 230 is configured to provide buffered clock signal CLKG0 to the input of counter circuit 227.

In another embodiment of FIG. 2C, buffer circuits 254 and 265 are enabled, and buffer circuits 255 and 272-273 are disabled. Buffer circuit 254 generates a buffered output clock signal CLKE1 in response to the clock signal selected by multiplexer 244. CLKE1 is transmitted from pin 284 through external conductor 294 to pin 285 at an input of buffer circuit 265. Buffer circuit 265 generates a buffered clock signal CLKG1 that is provided to an input of multiplexer 231 in response to clock signal CLKE1. Multiplexer 231 is configured to provide buffered clock signal CLKG1 to the input of counter circuit 228.

According to yet another embodiment of FIG. 2C, buffer circuits 252 and 263 are enabled, and buffer circuits 251, 261, 271-272, and 253 are disabled. Buffer circuit 252 generates a buffered output clock signal CLKE0 at pin 282 in response to the clock signal selected by multiplexer 242. CLKE0 is transmitted from pin 282 through external conductor 293 to pin 283 at an input of buffer circuit 263. Buffer circuit 263 generates a buffered clock signal CLKG2 that is provided to inputs of multiplexers 230-231 in response to clock signal CLKE0. Multiplexer 230 may be configured to provide buffered clock signal CLKG2 to the input of counter circuit 227. Multiplexer 231 may be configured to provide buffered clock signal CLKG2 to the input of counter circuit 228.

Each of the embodiments described above with respect to FIGS. 2B-2C implements a single-ended external feedback mode in which a feedback circuit path that generates the feedback clock signal for one of (or each of) clock signal generation circuits 201-202 includes an external conductor located outside the integrated circuit. For example, the feedback circuit path of circuit 201 can include one of multiplexers 211-212, one of counter circuits 221-222, multiplexer 241 or 242, buffer circuit 251 or 252, an external conductor, buffer circuit 263, multiplexer 230, and counter circuit 227.

Figure 2D:
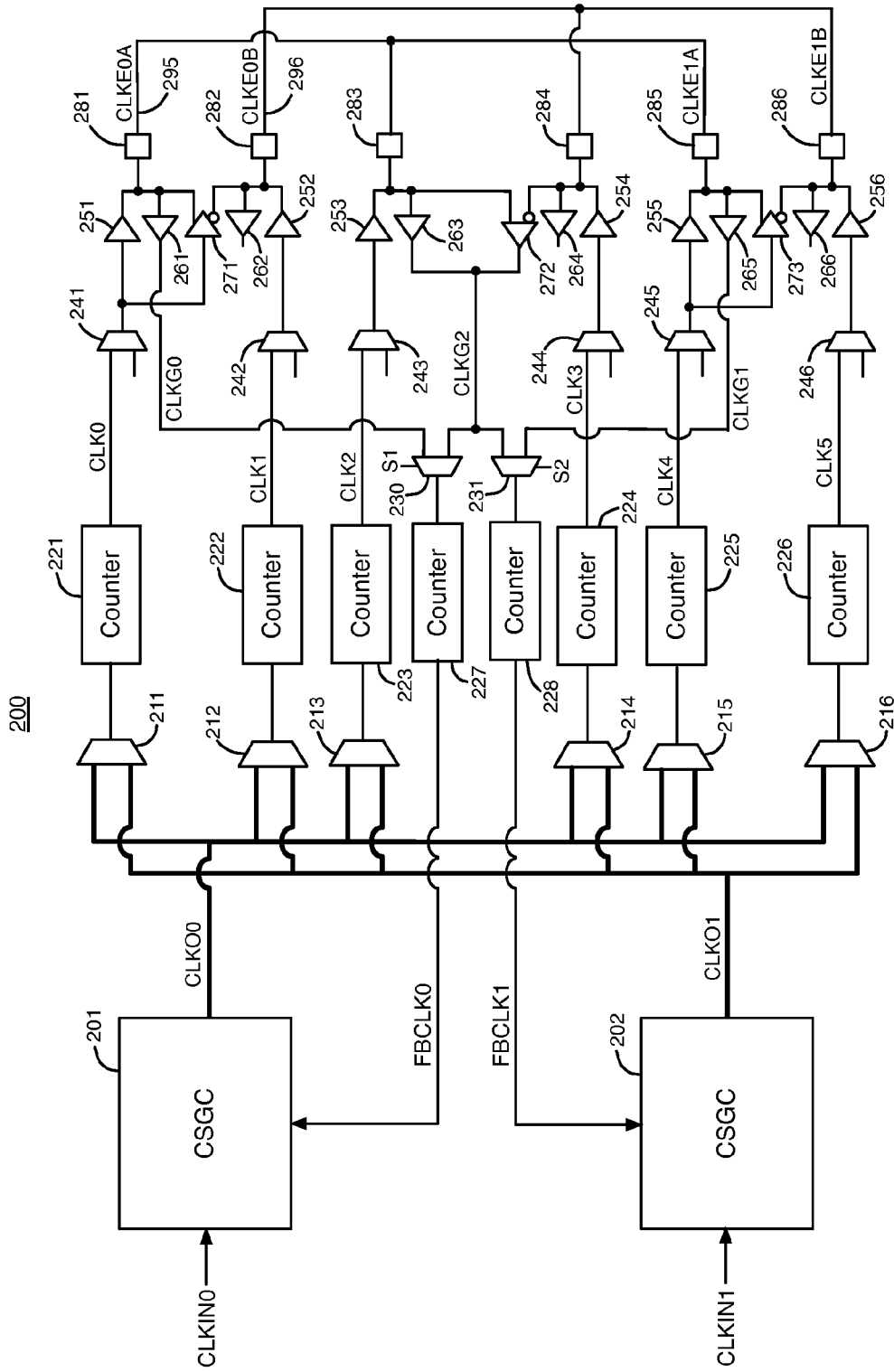
FIG. 2D illustrates additional alternative configurations of the input/output interface circuit of FIG. 2A that can be used for differential external feedback modes, according to embodiments of the present invention.

FIG. 2D illustrates additional alternative configurations of input/output interface circuit 200 that can be used for differential external feedback modes, according to embodiments of the present invention.

In one embodiment of FIG. 2D, differential buffer circuits 271-272 are enabled, differential buffer circuit 273 is disabled, and the single-ended buffer circuits 251-256 and 261-266 are disabled. In this embodiment, differential buffer circuit 271 generates a buffered differential clock signal that comprises clock signals CLKE0A and CLKE0B at output pins 281-282, respectively, in response to the single-ended output clock signal of multiplexer 241. Clock signals CLKE0A and CLKE0B are transmitted through external conductors 295-296 to input pins 283-284, respectively, at the inputs of differential buffer circuit 272. Conductors 295-296 are located outside the integrated circuit that contains interface 200. Differential buffer circuit 272 buffers the differential clock signal CLKE0A/CLKE0B to generate a single-ended buffered clock signal CLKG2 at the inputs of multiplexers 230-231.

According to another embodiment of FIG. 2D, differential buffer circuits 272-273 are enabled, differential buffer circuit 271 is disabled, and the single-ended buffer circuits 251-256 and 261-266 are disabled. In this embodiment, differential buffer circuit 273 generates a buffered differential clock signal that comprises clock signals CLKE1A and CLKE1B at output pins 285-286, respectively, in response to the single-ended output clock signal of multiplexer 245. Clock signals CLKE1A and CLKE1B are transmitted through external conductors 295-296 to input pins 283-284, respectively, at the inputs of differential buffer circuit 272. Differential buffer circuit 272 buffers the differential clock signal CLKE1A/CLKE1B to generate a single-ended buffered clock signal CLKG2 at the inputs of multiplexers 230-231. Multiplexer 230 can be configured to transmit CLKG2 to counter 227. Multiplexer 231 can be configured to transmit CLKG2 to counter 228.

Figure 3A:
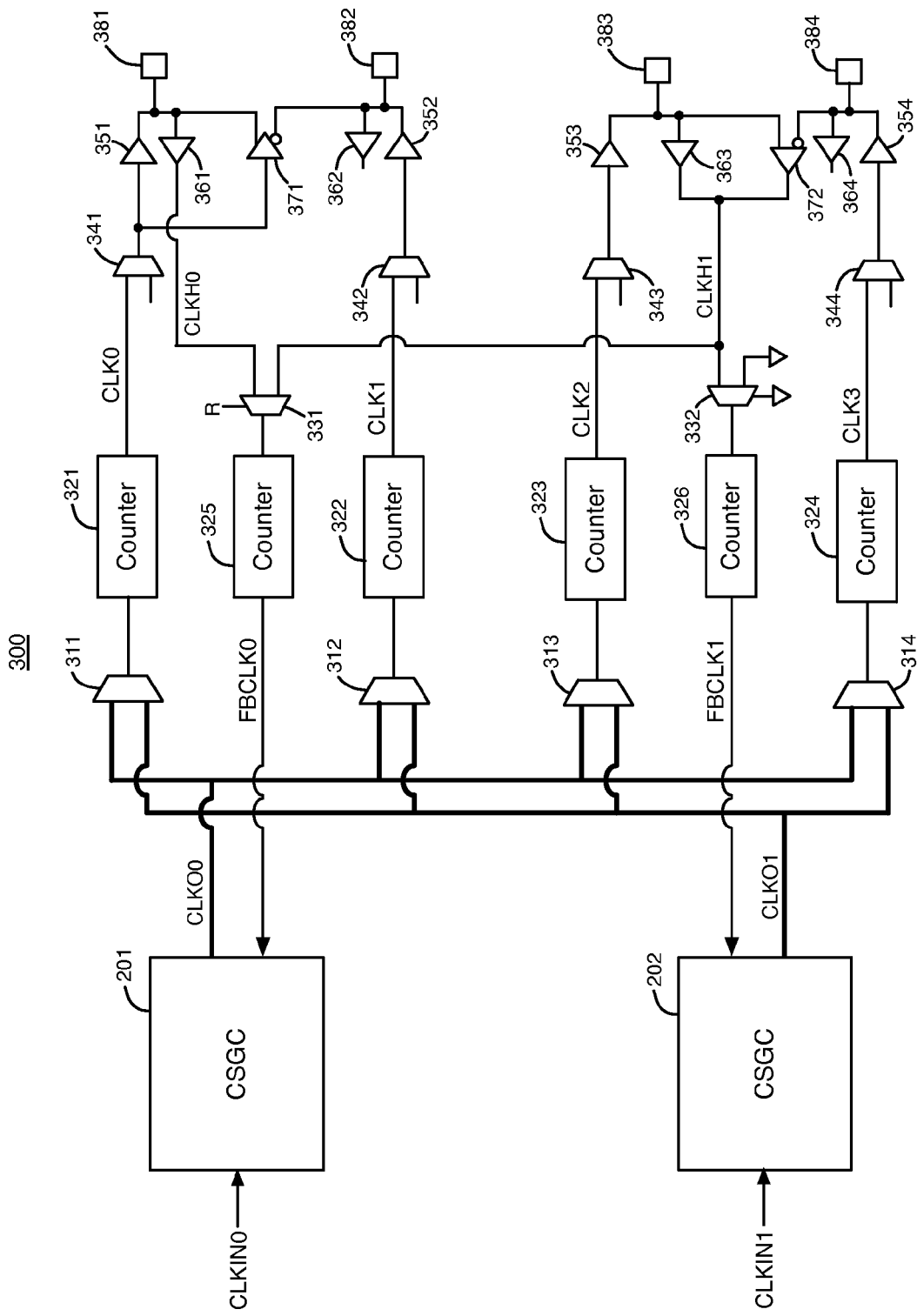
FIG. 3A illustrates a 4-pin input/output interface circuit on an integrated circuit, according to another embodiment of the present invention.

FIG. 3A illustrates a 4-pin input/output interface circuit 300 on an integrated circuit, according to another embodiment of the present invention. Input/output interface circuit 300 includes clock signal generation circuits 201-202, multiplexers 311-314, counter circuits 321-326, multiplexers 331-332 and 341-344, single-ended output buffer circuits 351-354, single-ended input buffer circuits 361-364, differential output buffer circuit 371, differential input buffer circuit 372, and 4 pins 381-384. Pins 381-384 are external terminals of the integrated circuit that contains interface circuit 300.

Each of the clock signal generation circuits 201-202 in interface 300 can, for example, include a phase-locked loop (PLL) circuit and a delay-locked loop (DLL) circuit. Alternatively, each of clock signal generation circuits 201-202 have a DLL but not a PLL. Clock signal generation circuits 201-202 in interface circuit 300 functions as described above with respect to interface circuit 200. The output clock signals CLKO0 of clock signal generation circuit 201 are provided to inputs of each of multiplexers 311-314. The output clock signals CLKO1 of clock signal generation circuit 202 are provided to inputs of each of multiplexers 311-314.

Each of the 4 multiplexer circuits 311-314 is configured to select one of the clock signals from among clock signals CLKO0 and CLKO1 in response to a select signal (not shown). Multiplexer circuits 311-314 provide the 4 selected clock signals to inputs of counter circuits 321-324, respectively. Counter circuits 321-324 function as frequency divider circuits. Counter circuits 321-324 divide the frequencies of the 4 clock signals selected by multiplexer circuits 311-314 to generate 4 frequency divided clock signals CLK0-CLK3, respectively. Multiplexer circuits 341-344 are configured by select signals (not shown) to provide the 4 frequency divided clock signals to inputs of output buffer circuits 351-354, respectively. Counter circuits 325-326 function as frequency multipliers.

In a single-ended zero delay buffer mode embodiment of interface circuit 300, buffer circuits 351, 361, 353, and 363 are enabled. Output buffer circuit 351 buffers the output clock signal of multiplexer 341 to generate a buffered clock signal at the input of input buffer circuit 361. Input buffer circuit 361 buffers the buffered output clock signal of buffer circuit 351 to generate a buffered clock signal CLKH0 that is provided to a first input of multiplexer 331.

Also in single-ended zero delay buffer mode, output buffer circuit 353 buffers the output clock signal of multiplexer 343 to generate a buffered output clock signal at the input of input buffer circuit 363. Input buffer circuit 363 buffers the buffered output clock signal of buffer circuit 353 to generate a buffered clock signal CLKH1 at a second input of multiplexer 331 and at a first input of multiplexer 332. The second input of multiplexer 332 is coupled to ground. The select input of multiplexer 332 is coupled to ground, which causes multiplexer 332 to select clock signal CLKH1. Clock signal CLKH1 is provided to an input of counter circuit 326. Counter circuit 326 generates feedback clock signal FBCLK1 based on clock signal CLKH1 as received from multiplexer 332. Feedback clock signal FBCLK1 is transmitted to an input of CSGC 202, as described above.

Multiplexer 331 is configured by select signal R to select either clock signal CLKH0 or clock signal CLKH1. The clock signal selected by multiplexer 331 is provided to the input of counter circuit 325. Counter circuit 325 generates feedback clock signal FBCLK0 based on the clock signal selected by multiplexer 331. Feedback clock signal FBCLK0 is transmitted to an input of CSGC 201, as described above.

Figure 3B:
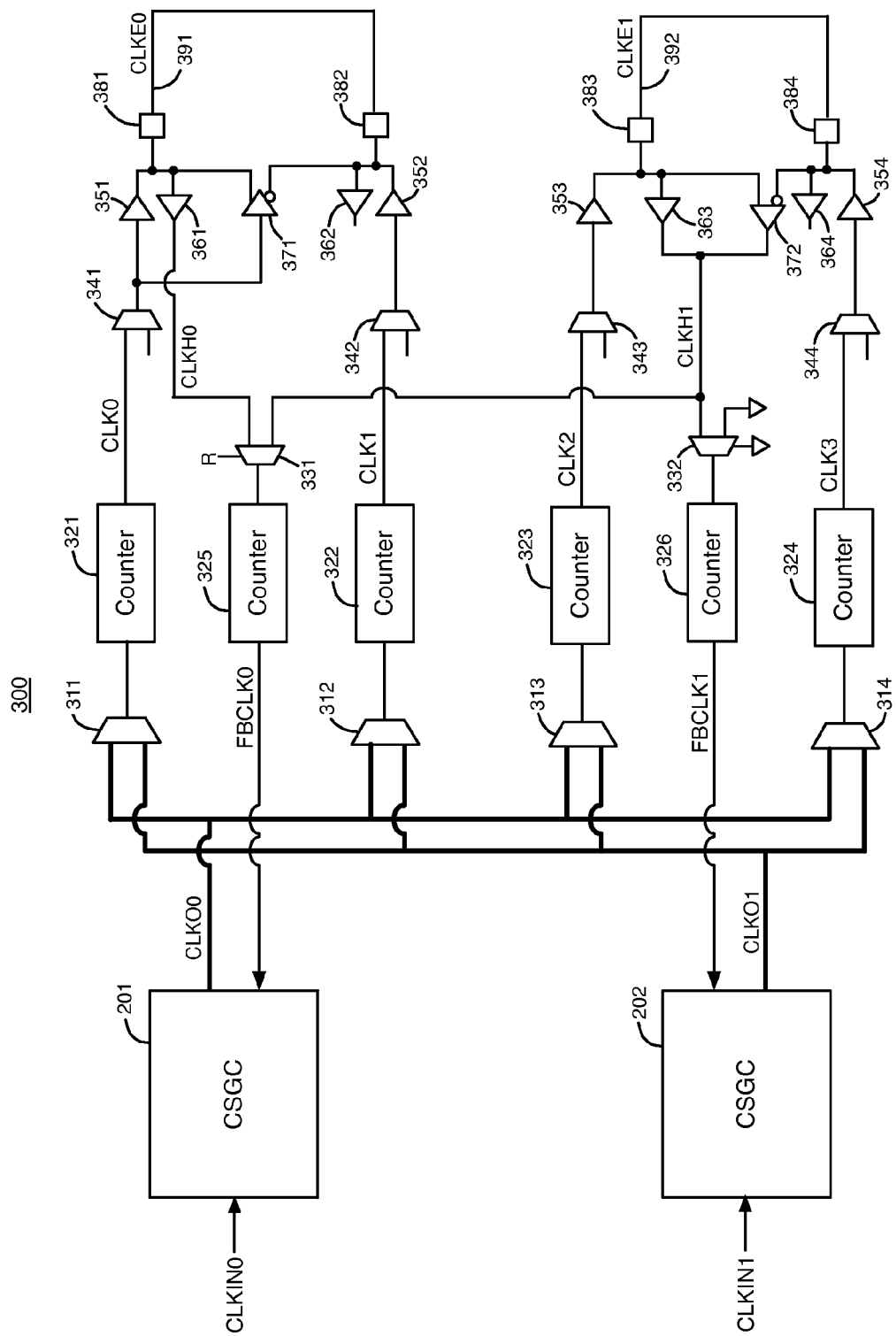
FIG. 3B illustrates alternative configurations of the input/output interface circuit of FIG. 3A that can be used for single-ended external feedback modes, according to additional embodiments of the present invention.

FIG. 3B illustrates alternative configurations of input/output interface circuit 300 that can be used for single-ended external feedback modes, according to additional embodiments of the present invention.

In a single-ended external feedback mode embodiment of interface 300, buffer circuits 352, 361, 354, and 363 are enabled, and buffer circuits 351, 353 and 371-372 are disabled. Output buffer circuit 352 buffers the output clock signal of multiplexer 342 to generate a buffered clock signal CLKE0 at pin 382. External conductor 391 shown in FIG. 3B is located outside the integrated circuit die that contains interface circuit 300. Clock signal CLKE0 is transmitted through external conductor 391 from pin 382 to pin 381.

Input buffer circuit 361 buffers the clock signal CLKE0 received from pin 381 to generate a buffered clock signal CLKH0 that is provided to an input of multiplexer circuit 331. Multiplexer circuit 331 is configured based on the logic state of select signal R to provide clock signal CLKH0 to an input of counter circuit 325. Counter circuit 325 generates clock signal FBCLK0 in response to the clock signal selected by multiplexer 331. Clock signal FBCLK0 is provided to an input of CSGC 201.

Also, in the single-ended external feedback mode, output buffer circuit 354 buffers the output clock signal of multiplexer 344 to generate a buffered clock signal CLKE1 at pin 384. External conductor 392 shown in FIG. 3B is located outside the integrated circuit die that contains interface circuit 300. Clock signal CLKE1 is transmitted through external conductor 392 from pin 384 to pin 383.

Input buffer circuit 363 buffers the clock signal CLKE1 received from pin 383 to generate a buffered clock signal CLKH1 that is provided to inputs of multiplexer circuits 331-332. Multiplexer circuit 332 is configured to select clock signal CLKH1. CLKH1 is provided from the output of multiplexer 332 to an input of counter circuit 326. Counter circuit 326 generates clock signal FBCLK1 in response to the output clock signal of multiplexer 332. Clock signal FBCLK1 is provided to CSGC 202. Multiplexer circuit 331 may be configured to select clock signal CLKH0 or clock signal CLKH1. The clock signal selected by multiplexer 331 is provided to the input of counter circuit 325. Counter circuit 325 generates FBCLK0 in response to the clock signal selected by multiplexer 331. Clock signal FBCLK0 is provided to CSGC 201.

Figure 3C:
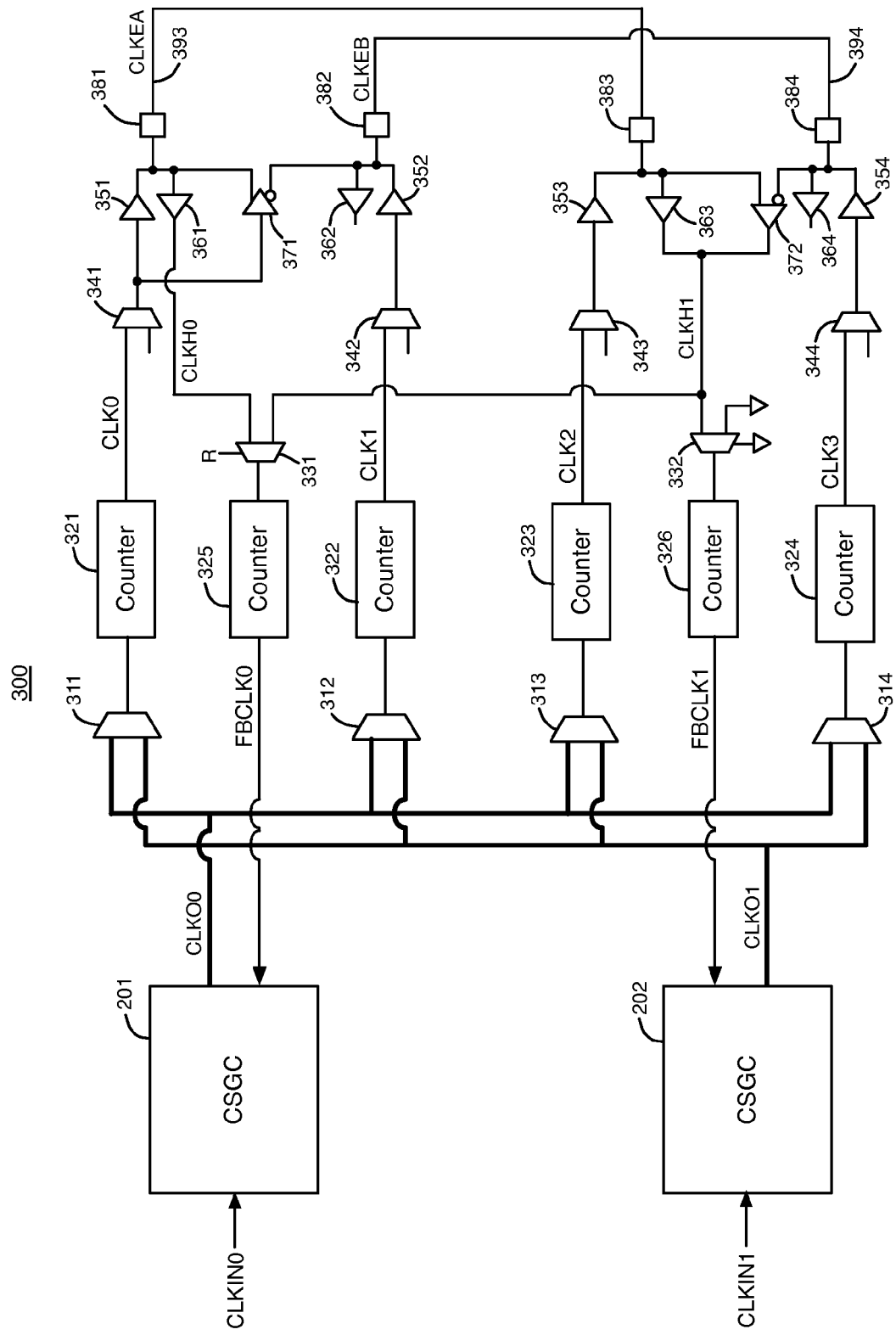
FIG. 3C illustrates additional alternative configurations of the input/output interface circuit of FIG. 3A that can be used for differential external feedback modes, according to embodiments of the present invention.

FIG. 3C illustrates additional alternative configurations of input/output interface circuit 300 that can be used for differential external feedback modes, according to embodiments of the present invention.

In one embodiment of FIG. 3C, differential buffer circuits 371-372 are enabled, and the single-ended buffer circuits 351-354 and 361-364 are disabled. In this embodiment, differential buffer circuit 371 generates a buffered differential clock signal that comprises clock signals CLKEA and CLKEB at output pins 381-382, respectively, in response to the single-ended output clock signal of multiplexer 341. Clock signals CLKEA and CLKEB are transmitted through external conductors 393-394 to input pins 383-384, respectively, at the inputs of differential buffer circuit 372. Conductors 393-394 are located outside the integrated circuit that contains interface 300. Differential buffer circuit 372 buffers the differential clock signal CLKEA/CLKEB to generate a single-ended buffered clock signal CLKH1 at inputs of multiplexers 331-332.

Multiplexer circuit 332 is configured to select clock signal CLKH1. CLKH1 is provided from the output of multiplexer 332 to an input of counter circuit 326. Counter circuit 326 generates clock signal FBCLK1 in response to the clock signal selected by multiplexer 332, as described above. Multiplexer circuit 331 may be configured to select clock signal CLKH0 or clock signal CLKH1. The clock signal selected by multiplexer 331 is provided to the input of counter circuit 325. Counter circuit 325 generates clock signal FBCLK0 in response to the clock signal selected by multiplexer 331, as described above.

According to some embodiments of FIGS. 3A-3C, one or more of output buffer circuits 351-354 and 371 can transmit output signals to additional external pins (not shown) of the integrated circuit (e.g., 4 additional external pins). One or more of input buffer circuits 361-364 and 372 can receive input signals from the additional external pins.

Figure 4:
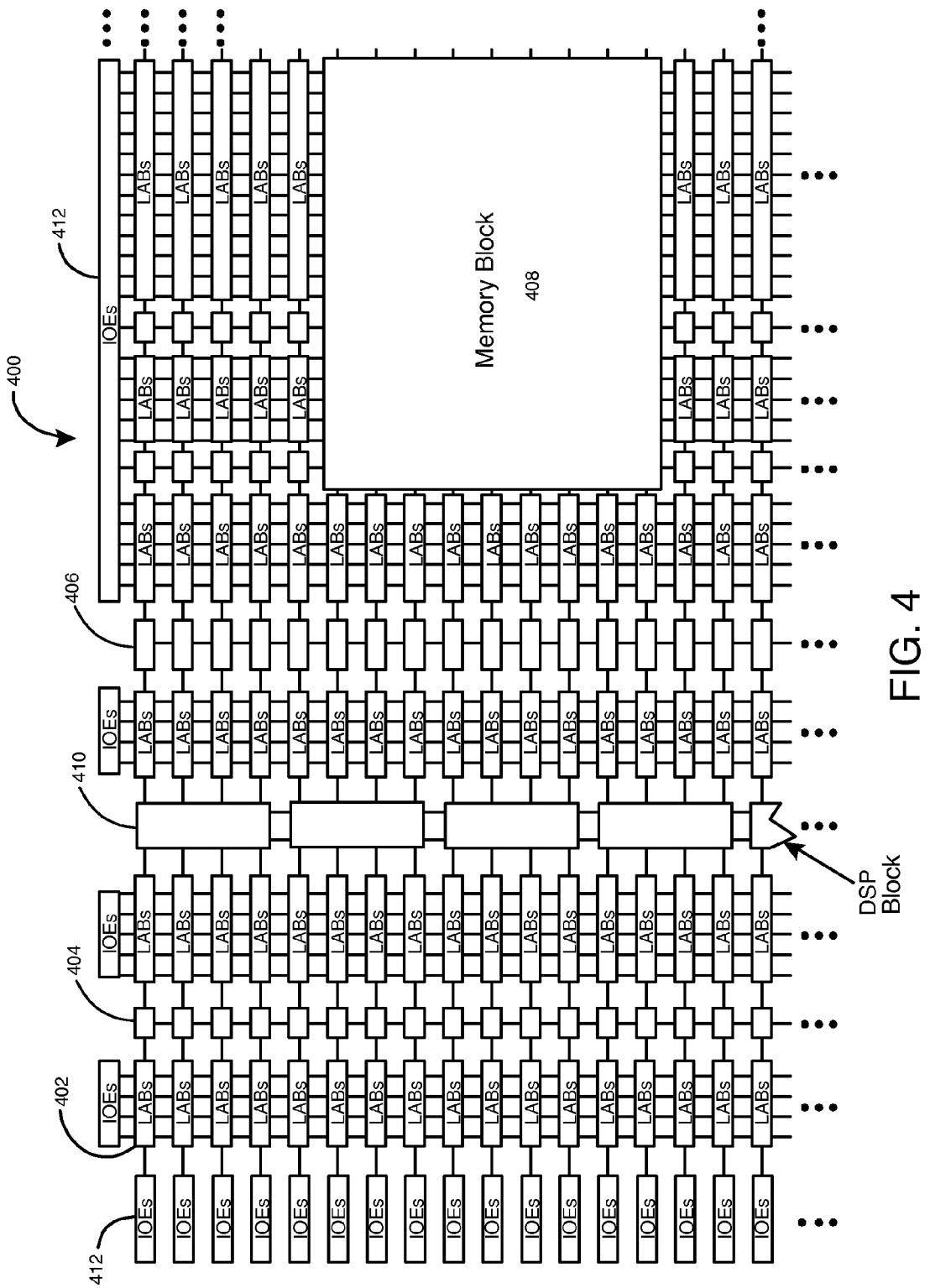
FIG. 4 is a simplified partial block diagram of a field programmable gate array (FPGA) that can include aspects of the present invention.

FIG. 4 is a simplified partial block diagram of a field programmable gate array (FPGA) 400 that can include aspects of the present invention. FPGA 400 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 400 includes a two-dimensional array of programmable logic array blocks (or LABs) 402 that are interconnected by a network of column and row interconnect conductors of varying length and speed. LABs 402 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 400 also includes a distributed memory structure including random access memory (RAM) blocks of varying sizes provided throughout the array. The RAM blocks include, for example, blocks 404, blocks 406, and block 408. These memory blocks can also include shift registers and first-in-first-out (FIFO) buffers.

FPGA 400 further includes digital signal processing (DSP) blocks 410 that can implement, for example, multipliers with add or subtract features. Input/output elements (IOEs) 412 located, in this example, around the periphery of the chip, support numerous single-ended and differential input/output standards. IOEs 412 include input and output buffers that are coupled to pins of the integrated circuit. The pins are external terminals of the FPGA die that can be used to route, for example, input signals, output signals, and supply voltages between the FPGA and one or more external devices. It should be understood that FPGA 400 is described herein for illustrative purposes only and that the present invention can be implemented in many different types of integrated circuits.

Figure 5:
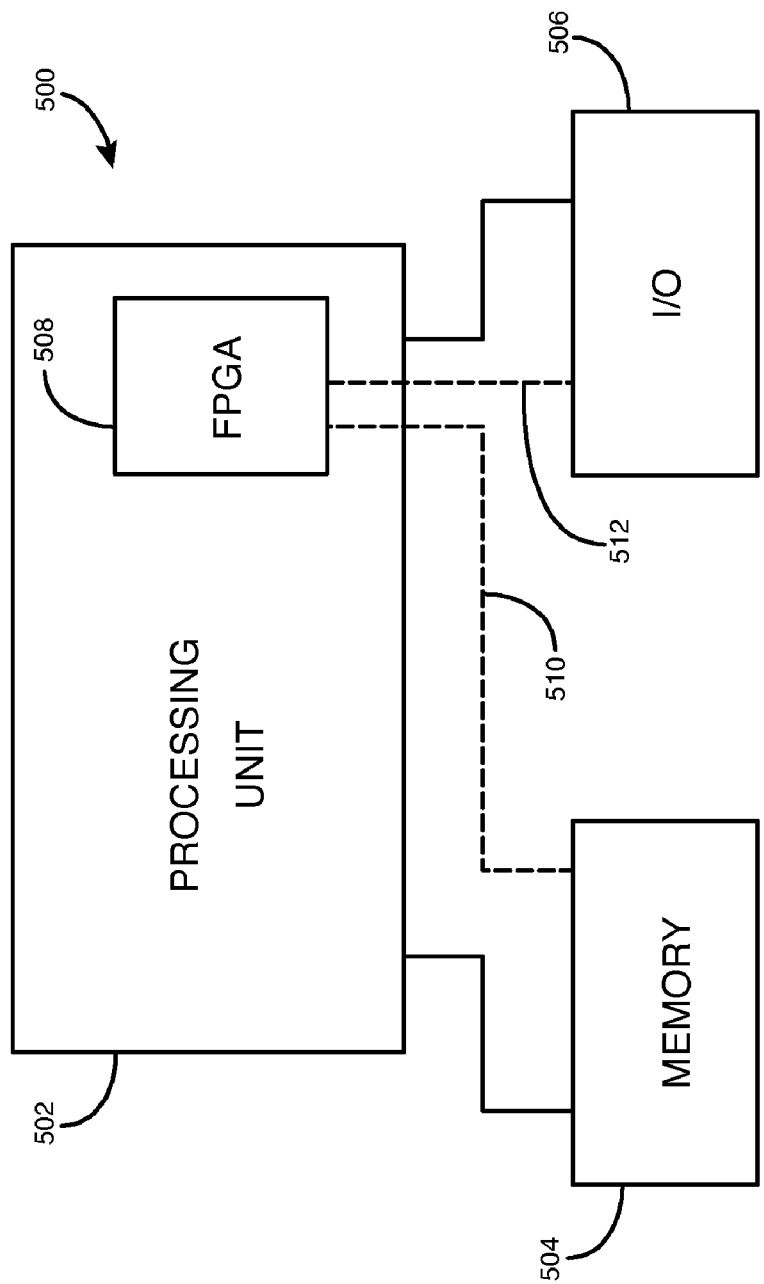
FIG. 5 shows a block diagram of an exemplary digital system that can embody techniques of the present invention.

The present invention can also be implemented in a system that has an FPGA as one of several components. FIG. 5 shows a block diagram of an exemplary digital system 500 that can embody techniques of the present invention. System 500 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 500 can be provided on a single board, on multiple boards, or within multiple enclosures.

System 500 includes a processing unit 502, a memory unit 504, and an input/output (I/O) unit 506 interconnected together by one or more buses. According to this exemplary embodiment, an FPGA 508 is embedded in processing unit 502. FPGA 508 can serve many different purposes within the system of FIG. 5. FPGA 508 can, for example, be a logical building block of processing unit 502, supporting its internal and external operations. FPGA 508 is programmed to implement the logical functions necessary to carry on its particular role in system operation. FPGA 508 can be specially coupled to memory 504 through connection 510 and to I/O unit 506 through connection 512.

Processing unit 502 can direct data to an appropriate system component for processing or storage, execute a program stored in memory 504, receive and transmit data via I/O unit 506, or other similar functions. Processing unit 502 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 508 can control the logical operations of the system. As another example, FPGA 508 acts as a reconfigurable processor that can be reprogrammed as needed to handle a particular computing task. Alternatively, FPGA 508 can itself include an embedded microprocessor. Memory unit 504 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
   a first periodic signal generation circuit providing first periodic output signals;
   a second periodic signal generation circuit providing second periodic output signals;
   a first multiplexer circuit receiving the first and the second periodic output signals;
   an interface circuit coupled to external pins that generates a third periodic output signal based on a periodic signal selected by the first multiplexer circuit;
   a second multiplexer circuit that receives the third periodic output signal at a first input, wherein a first periodic feedback signal provided to the first periodic signal generation circuit is based on a signal selected by the second multiplexer circuit; and
   a third multiplexer circuit that receives the third periodic output signal at a first input, wherein a second periodic feedback signal provided to the second periodic signal generation circuit is based on a signal selected by the third multiplexer circuit.

2. The circuit of claim 1 wherein the first periodic signal generation circuit comprises a first phase-locked loop circuit, and wherein the second periodic signal generation circuit comprises a second phase-locked loop circuit.

3. The circuit of claim 1 further comprising:
   a fourth multiplexer circuit that receives the first and the second periodic output signals, wherein the interface circuit generates a fourth periodic output signal in response to a periodic signal selected by the fourth multiplexer circuit, and wherein the second multiplexer circuit receives the fourth periodic output signal at a second input.

4. The circuit of claim 3 further comprising:
a fifth multiplexer circuit that receives the first and the second periodic output signals, wherein the interface circuit generates a fifth periodic output signal in response to a periodic signal selected by the fifth multiplexer circuit, and wherein the third multiplexer circuit receives the fifth periodic output signal at a second input.

5. The circuit of claim 4 further comprising:
a first frequency divider circuit that generates a first frequency divided signal based on the periodic signal selected by the first multiplexer circuit, wherein the interface circuit generates the third periodic output signal based on the first frequency divided signal;
a second frequency divider circuit that generates a second frequency divided signal based on the periodic signal selected by the fourth multiplexer circuit, wherein the interface circuit generates the fourth periodic output signal based on the second frequency divided signal; and
a third frequency divider circuit that generates a third frequency divided signal based on the periodic signal selected by the fifth multiplexer circuit, wherein the interface circuit generates the fifth periodic output signal based on the third frequency divided signal.

6. The circuit of claim 3 further comprising:
a first frequency divider circuit that generates a first frequency divided signal based on the periodic signal selected by the first multiplexer circuit, wherein the interface circuit generates the third periodic output signal based on the first frequency divided signal; and
a second frequency divider circuit that generates a second frequency divided signal based on the periodic signal selected by the fourth multiplexer circuit, wherein the interface circuit generates the fourth periodic output signal based on the second frequency divided signal.

7. The circuit of claim 1 wherein the first periodic signal generation circuit comprises a first delay-locked loop circuit, and wherein the second periodic signal generation circuit comprises a second delay-locked loop circuit.

8. The circuit of claim 1 wherein the circuit is in a programmable logic integrated circuit.

9. The circuit of claim 1 wherein the interface circuit comprises input and output buffer circuits coupled to the external pins.

10. A circuit comprising:
a first periodic signal generation circuit generating first periodic output signals;
a second periodic signal generation circuit generating second periodic output signals;
a first multiplexer circuit receiving the first and the second periodic output signals;
a second multiplexer circuit receiving the first and the second periodic output signals;
an interface circuit coupled to external pins that generates a third periodic output signal based on a periodic signal selected by the first multiplexer circuit and that generates a fourth periodic output signal based on a periodic signal selected by the second multiplexer circuit; and
a third multiplexer circuit that receives the third periodic output signal at a first input and the fourth periodic output signal at a second input, wherein a first periodic feedback signal provided to the first periodic signal generation circuit is based on a periodic signal selected by the third multiplexer circuit.

11. The circuit of claim 10 further comprising:
a fourth multiplexer circuit that receives the third periodic output signal at a first input, wherein a second periodic feedback signal provided to the second periodic signal generation circuit is based on a periodic signal selected by the fourth multiplexer circuit.

12. The circuit of claim 11 further comprising:
a fifth multiplexer circuit that receives the first and the second periodic output signals, wherein the interface circuit generates a fifth periodic output signal in response to a periodic signal selected by the fifth multiplexer circuit, and wherein the fourth multiplexer circuit receives the fifth periodic output signal at a second input.

13. The circuit of claim 12 further comprising:
a sixth multiplexer circuit that receives the first and the second periodic output signals.

14. The circuit of claim 11 further comprising:
a first frequency multiplier circuit that generates the first periodic feedback signal based on the periodic signal selected by the third multiplexer circuit; and
a second frequency multiplier circuit that generates the second periodic feedback signal based on the periodic signal selected by the fourth multiplexer circuit.

15. The circuit of claim 10 further comprising:
a first frequency divider circuit that generates a first frequency divided signal based on the periodic signal selected by the first multiplexer circuit, wherein the interface circuit generates the third periodic output signal based on the first frequency divided signal; and
a second frequency divider circuit that generates a second frequency divided signal based on the periodic signal selected by the second multiplexer circuit, wherein the interface circuit generates the fourth periodic output signal based on the second frequency divided signal.

16. The circuit of claim 10 wherein the interface circuit comprises single-ended buffer circuits coupled to the external pins and differential buffer circuits coupled to the external pins, and wherein the circuit is an integrated circuit.

17. A method comprising:
generating first periodic output signals from a first periodic signal generation circuit;
generating second periodic output signals from a second periodic signal generation circuit;
selecting one of the first and the second periodic output signals received at a first multiplexer as a first selected signal;
generating a third periodic output signal in response to the first selected signal using a first input buffer circuit and a first output buffer circuit;
selecting the third periodic output signal to generate a second selected signal using a second multiplexer; and
providing a first periodic feedback signal to the first periodic signal generation circuit in response to the second selected signal.

18. The method of claim 17 further comprising:
selecting one of the first and the second periodic output signals received at a third multiplexer as a third selected signal;
generating a fourth periodic output signal using a second input buffer circuit and a second output buffer circuit in response to the third selected signal;
selecting the fourth periodic output signal to generate a fourth selected signal using a fourth multiplexer; and
providing a second periodic feedback signal to the second periodic signal generation circuit in response to the fourth selected signal.

19. The method of claim 18 further comprising:
selecting one of the first and the second periodic output signals received at a fifth multiplexer as a fifth selected signal;

generating a fifth periodic output signal using a third input buffer circuit and a third output buffer circuit in response to the fifth selected signal; and selecting the fifth periodic output signal to generate the fourth selected signal using the fourth multiplexer.

20. The method of claim 19 wherein generating a third periodic output signal in response to the first selected signal using a first input buffer circuit and a first output buffer circuit further comprises transmitting a periodic signal through an external conductor located outside an integrated circuit containing the first input buffer circuit and the first output buffer circuit.

* * * * *